US012801008B2

(12) United States Patent
Lee et al.

(10) Patent No.: US 12,801,008 B2
(45) Date of Patent: Nov. 17, 2026

(54) PHOTOMASK BLANK, PHOTOMASK, AND MANUFACTURING METHOD OF SEMICONDUCTOR ELEMENT

(71) Applicant: LuminaMask Co., Ltd., Cheonan-si (KR)

(72) Inventors: GeonGon Lee, Seoul (KR); Suk Young Choi, Seoul (KR); Hyung-joo Lee, Seoul (KR); Sung Hoon Son, Seoul (KR); Inkyun Shin, Seoul (KR); Seong Yoon Kim, Seoul (KR); Min Gyo Jeong, Seoul (KR)

(73) Assignee: LuminaMask Co., Ltd., Cheonan-si (KR)

( * ) Notice: Subject to any disclaimer, the term of this patent is extended or adjusted under 35 U.S.C. 154(b) by 1149 days.

(21) Appl. No.: 17/733,103

(22) Filed: Apr. 29, 2022

(65) Prior Publication Data

US 2022/0350238 A1 Nov. 3, 2022

(30) Foreign Application Priority Data

Apr. 30, 2021 (KR) ........................ 10-2021-0056931
Apr. 30, 2021 (KR) ........................ 10-2021-0056932

(51) Int. Cl.
*G03F 1/32* (2012.01)
*G03F 1/50* (2012.01)
*H10P 76/00* (2026.01)

(52) U.S. Cl.
CPC .................. *G03F 1/32* (2013.01); *G03F 1/50* (2013.01); *H10P 76/00* (2026.01)

(58) Field of Classification Search
None
See application file for complete search history.

(56) References Cited

U.S. PATENT DOCUMENTS 6,627,097 B2 9/2003 Fukuzawa et al.
10,428,415 B2 10/2019 Park et al.
2004/0151992 A1* 8/2004 Nagamura ................ G03F 1/74 430/5
2007/0020534 A1 1/2007 Yoshikawa et al.
2007/0212618 A1* 9/2007 Yoshikawa ............... G03F 1/80 428/428
2011/0027699 A1 2/2011 Tchikoulaeva et al.
(Continued)

FOREIGN PATENT DOCUMENTS

CN 103299241 B 3/2016
JP 57-73741 A 5/1982
(Continued)

OTHER PUBLICATIONS

JP-2010084202 English Translation (Year: 2025).*
(Continued)

*Primary Examiner* — Benjamin L Utech
(74) *Attorney, Agent, or Firm* — NSIP Law

(57) ABSTRACT

A photomask blank includes a light-transmitting substrate, and a shading layer part disposed on the light-transmitting substrate, the shading layer part including a first shading layer having a first hardness and a second shading layer having a second hardness. The first shading layer is disposed closer to the light-transmitting substrate than the second shading layer, and a value of the first hardness is larger that a value of the second hardness.

9 Claims, 5 Drawing Sheets

A

(56) References Cited

U.S. PATENT DOCUMENTS

| | | | | |
|---|---|---|---|---|
| 2013/0122407 | A1 | 5/2013 | Hashimoto et al. | |
| 2018/0335693 | A1* | 11/2018 | Hiromatsu | G03F 1/40 |
| 2019/0369485 | A1* | 12/2019 | Hashimoto | G03F 1/72 |

FOREIGN PATENT DOCUMENTS

| | | | | | |
|---|---|---|---|---|---|
| JP | 57073741 | A | * | 5/1982 | G03F 1/46 |
| JP | 2007-033470 | A | | 2/2007 | |
| JP | 2009-204839 | A | | 9/2009 | |
| JP | 2010-84202 | A | | 4/2010 | |
| JP | 2010084202 | A | * | 4/2010 | |
| JP | 2012-3255 | A | | 1/2012 | |
| JP | 2019-012132 | A | | 1/2019 | |
| KR | 10-2004-0005647 | A | | 1/2004 | |
| KR | 2006-343601 | A | | 12/2006 | |
| KR | 10-2012-0121333 | A | | 11/2012 | |
| KR | 10-1308838 | B | | 9/2013 | |
| KR | 10-2016-0034315 | A | | 3/2016 | |
| KR | 10-2018-0002114 | A | | 1/2018 | |
| KR | 10-2020-0066178 | A | | 6/2020 | |
| KR | 10-2020-0113553 | A | | 10/2020 | |
| TW | I518445 | B | | 1/2016 | |
| TW | I613506 | B | | 2/2018 | |
| TW | I713231 | B | | 12/2020 | |

OTHER PUBLICATIONS

JP-57073741-A English Translation (Year: 2025).*

Yijie Jiang, Kevin T. Turner, "Measurement of the strength and range of adhesion using atomic force microscopy", Extreme Mechanics Letters, vol. 9, Part 1, 2016, pp. 119-126 (Year: 2016).*

Jyh-Wei Lee, Jenq-Gong Duh, "Nanomechanical properties evaluation of chromium nitride films by nanoindentation and nanowear techniquesâ, Surface and Coatings Technology, vols. 188" 189, 2004, pp. 655-661 (Year: 2004).*

Hviscova et. al., Nanohardness of CrN Coatings versus Deposition Parameters, Key Engineering Materials, vol. 606, p. 191-194 (Year: 2014).*

* cited by examiner

PHOTOMASK BLANK, PHOTOMASK, AND MANUFACTURING METHOD OF SEMICONDUCTOR ELEMENT

CROSS-REFERENCE TO RELATED APPLICATIONS

This application claims the benefit under 35 USC 119(a) of Korean Patent Application No. 10-2021-0056931 filed on Apr. 30, 2021, and Korean Patent Application No. 10-2021-0056932 filed on Apr. 30, 2021, in the Korean Intellectual Property Office, the entire disclosures of which are incorporated herein by reference for all purposes.

BACKGROUND

1. Field

The following description relates to a photomask blank, photomask, and manufacturing method of a semiconductor element.

2. Description of Related Art

Miniaturization of circuit patterns of semiconductor devices may be desired due to the high integration of semiconductor devices or the like. For this reason, the importance of a lithography technique, which is a technique for developing a circuit pattern on a wafer surface using a photomask, is being further emphasized.

For developing a miniaturized circuit pattern, a light source of exposure used in an exposure process (photolithography) may be desired to be a short wavelength. As the light source of exposure used recently, there is ArF excimer laser (wavelength of 193 nm) or the like.

On the other hand, there are Binary mask, Phase shift mask, and the like as photomasks.

The Binary mask has a structure in which a shading pattern layer is formed on a light-transmitting substrate. In a surface where a pattern is formed from the Binary mask, a transparent portion not including a shading layer allows light for exposure to be transmitted, and a shading portion including a shading layer shields light for exposure, to expose a pattern on resist film of the surface of a wafer. However, the Binary mask may cause a problem in developing a minute pattern due to diffraction of light occurring at the edge of the transparent portion as the pattern is further miniaturized.

As a phase shift mask, there are Levenson type, Outrigger type, and Half-tone type. Among the above, Half-tone type phase shift mask has a structure in which a pattern formed with semi-transparent layer is formed on a transparent substrate. In a surface where a pattern is formed from the Half-tone type phase shift mask, a transparent portion not including a semi-transparent layer allows light for exposure to be transmitted, and a semi-transparent portion including a semi-transparent layer allows attenuated light for exposure to be transmitted. The attenuated light for exposure is allowed to have a phase retardation compared to light for exposure which has entered the transparent portion. Accordingly, diffraction light occurring at the edge of the transparent portion is counteracted by the light for exposure which has transmitted the semi-transparent portion, and thereby the phase shift mask can form a further refined minute pattern on the surface of a wafer.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a photomask blank includes a light-transmitting substrate, and a shading layer part disposed on the light-transmitting substrate, the shading layer part including a first shading layer having a first hardness and a second shading layer having a second hardness. The first shading layer is disposed closer to the light-transmitting substrate than the second shading layer, and a value of the first hardness is larger that a value of the second hardness.

The second hardness may be 0.15 times to 0.55 times of the first hardness.

The second hardness may be 0.3 kPa to 0.55 kPa.

A Young's modulus of the second shading layer may be 1.0 kPa or more.

A value of standard deviation of adhesion forces of the second shading layer may be measured at sixteen positions different from one another, which may be 8% or less of an average of the adhesion forces.

A value of standard deviation of pull off forces of the second shading layer may be measured at sixteen positions different from one another, which may be 5% or less of an average of the pull off forces.

A second Young's modulus of the second shading layer may be 0.15 times to 0.55 times of a first Young's modulus of the first shading layer.

A Young's modulus of the second shading layer may be 1.0 kPa to 4.2 kPa.

A thickness of the second shading layer may be 30 nm or more.

A thickness ratio of the first shading layer and a thickness ratio of the second shading layer may be 1:0.02 to 0.25.

A transmissivity of the shading layer part may be 1 or more for light having a wavelength of 193 nm.

An optical density of the shading layer part may be 1.8 or more for light having a wavelength of 193 nm.

In another general aspect, a photomask blank includes a light-transmitting substrate, and a patterned shading layer part disposed on the light-transmitting substrate, the patterned shading layer part including a patterned first shading layer having a first Young's modulus and a patterned second shading layer having a second Young's modulus smaller than the first hardness. The patterned first shading layer is disposed closer to the light-transmitting substrate than the patterned second shading layer.

In another general aspect, a manufacturing method of a semiconductor element includes preparing a target substrate, and applying a photomask on one surface of the target substrate to pattern the target substrate to form a patterned target substrate into a semiconductor element. The photomask includes a patterned shading layer part disposed on a light-transmitting substrate, the patterned shading layer part includes a patterned first shading layer having a first Young's modulus and a patterned second shading layer having a second Young's modulus smaller than the first hardness. The patterned first shading layer is disposed closer to the light-transmitting substrate than the patterned second shading layer.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
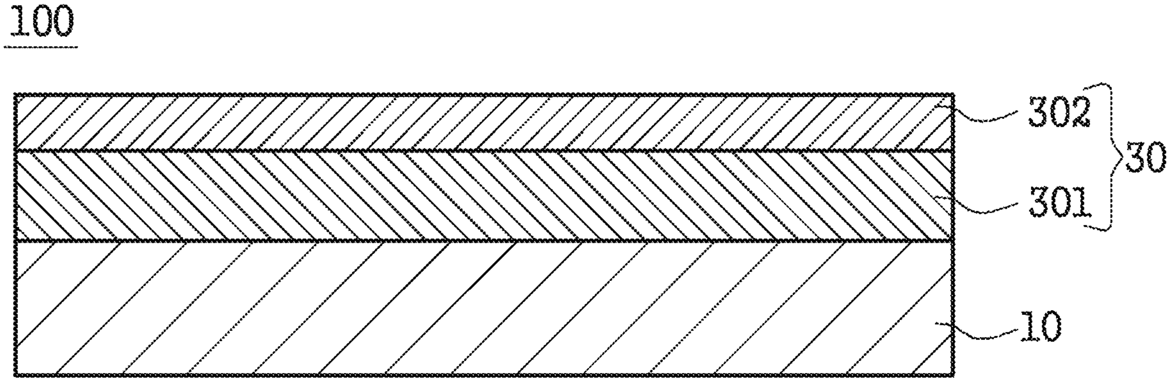
FIG. 1 is a conceptual view illustrating an example of a structure of a photomask blank according to one embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

In this application, the wavelength of exposure light is described as ArF wavelength of 193 nm, but unless specially described, the scope of right is not analyzed to be limited in being applied to the wavelength.

Due to the high integration of semiconductor elements, a further miniatured circuit pattern may be desired on a semiconductor substrate. Furthermore, as the critical dimension of a pattern developed on the semiconductor substrate is further miniatured, the defects caused by particles may also be desired to be more strictly controlled.

One embodiment provides a photomask blank and a photomask having improved performance. Another embodiment provides a manufacturing method of a semiconductor element in which the occurrence of defects is decreased with high accuracy.

A photomask applied as a mask for forming a semiconductor element pattern may have an excellent resolution as a desired characteristic. Different from a photomask for a display, a photomask for a semiconductor applied with an enlarged pattern may desirably need to be applied by a further strict condition for the resolution or defects thereof.

The edge of an upper portion of a pattern (indicated as A in FIG. 2 or the like) is ideal when substantially formed at a right angle at the section thereof; however, practically, it may not be easy to form in a complete right angle. A photomask may have particles caused by the edge part or the like during an etching process, and these particles may function as scratching particles of a photomask. That is, these particles may damage a substrate or a pattern in processes such as etching, cleaning, and the like, and finally it leads to the occurrence of defects in a pattern of a photomask and a semiconductor pattern manufactured from the photomask pattern. The inventors have verified that the occurrence of particles can be substantially suppressed by forming a shading layer part of a photomask to have a structure of two layers or more and controlling the characteristics such as hardness between respective layers, and disclose example embodiments.

Figure 2:
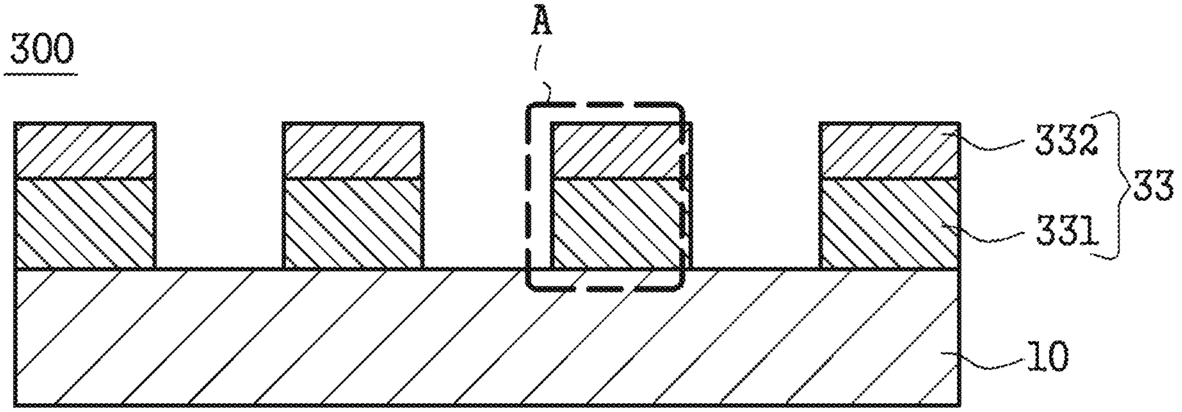
FIG. 2 is a conceptual view illustrating an example of a photomask structure according to one embodiment.
Figure 3:
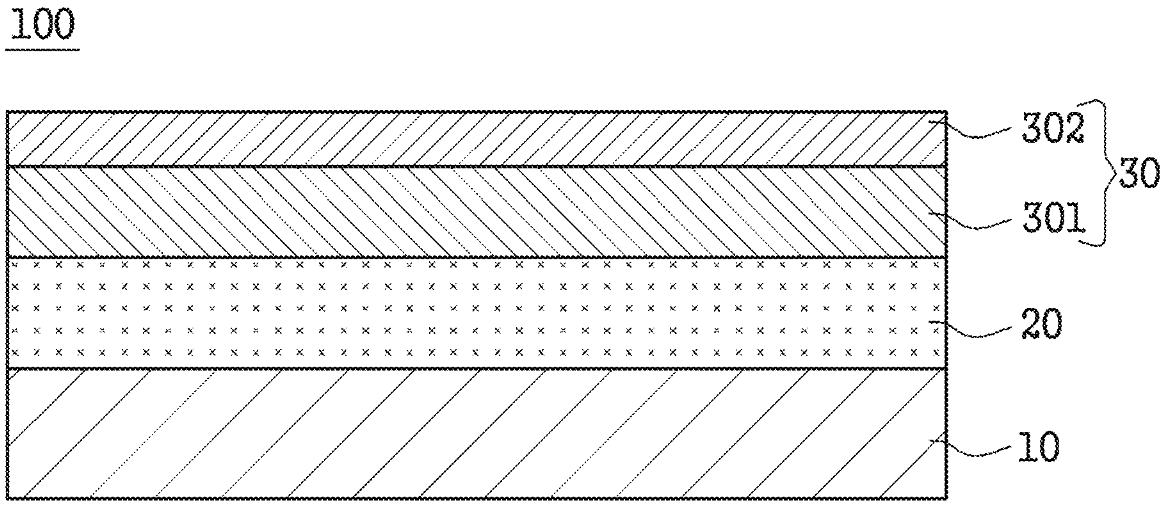
FIG. 3 is a conceptual view illustrating an example of a structure of a photomask blank according to another embodiment.
Figure 4:
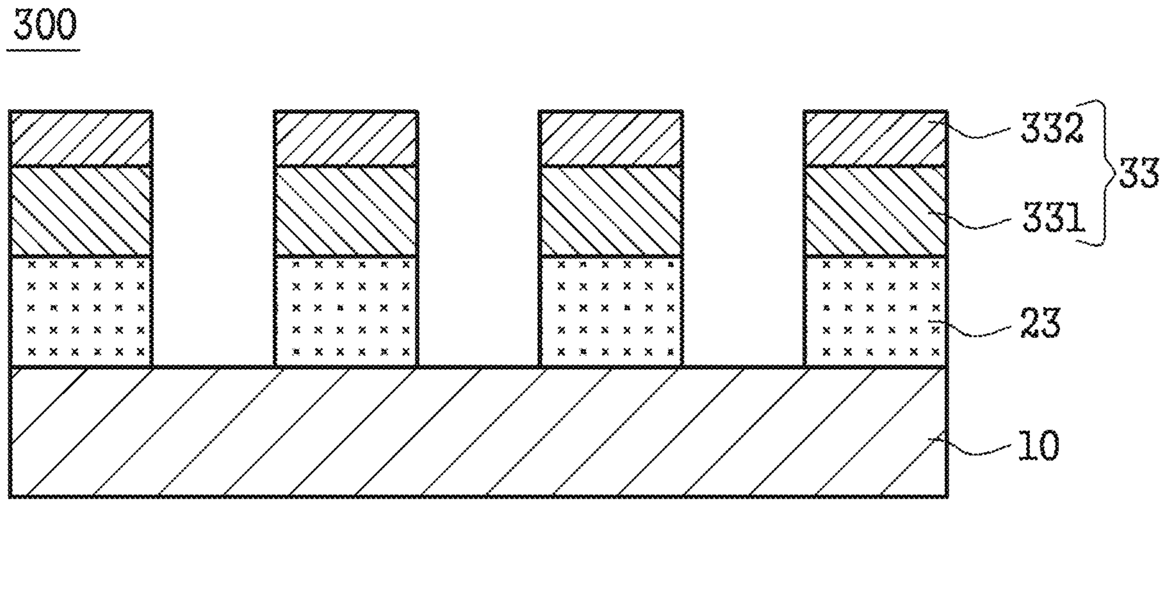
FIG. 4 is a conceptual view illustrating an example of a photomask structure according to another embodiment.
Figure 5:
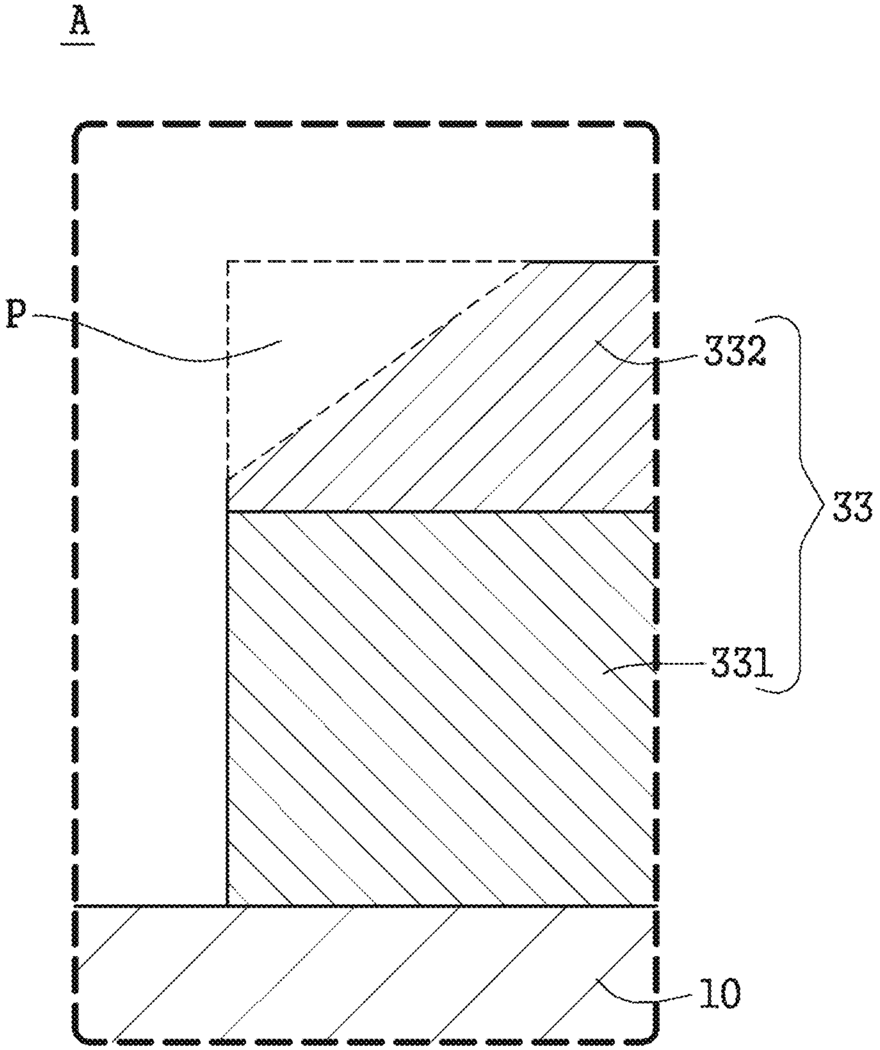
FIG. 5 is an enlarged conceptual view of A in FIG. 2.

FIG. 1 and FIG. 3 are conceptual views for illustrating the structure of a photomask blank according to one embodiment and another embodiment, respectively, and FIG. 2 and FIG. 4 are conceptual views for illustrating the structure of a photomask according to one embodiment and another embodiment, respectively. FIG. 5 is an enlarged conceptual view of A in FIG. 2. Hereinafter, with reference to FIG. 1 to FIG. 5, example embodiments will be described in further detail.

Photomask Blank 100 and Photomask 300

In one general aspect, a photomask blank 100, according to one embodiment of the present disclosure, comprises a light-transmitting substrate 10; and a shading layer part 30 with multiple layers disposed on the light-transmitting substrate.

The shading layer part 30 comprises a first shading layer 310 having a first hardness; and a second shading layer 302 having a second hardness.

The first shading layer 310 is disposed to be closer to the light-transmitting substrate 10 than the second shading layer.

The photomask blank 100 may further comprise a phase shift layer 20 disposed between the light-transmitting substrate 10; and the shading layer part 30.

The photomask blank 100 may further comprise a hard coating layer (not shown) disposed on the shading layer part 30.

The photomask blank 100 may further comprise a hard coating layer (not shown) disposed on the shading layer part 30, and a photoresist layer (not shown) disposed on the hard coating layer.

In one general aspect, a photomask 300, according to one embodiment of the present disclosure, comprises a light-transmitting substrate 10; and a patterned shading layer part 33 with multiple layers disposed on the light-transmitting substrate.

The patterned shading layer part 33 comprises a patterned first shading layer 331 having a first hardness; and a patterned second shading layer 332 having a second hardness.

The patterned first shading layer 331 is disposed to be closer to the light-transmitting substrate 10 than the patterned second shading layer 332.

The photomask 300 may further comprise a patterned phase shift layer 23 disposed between the light-transmitting substrate 10; and the patterned shading layer part 33.

The photomask 300 may further comprise a hard coating layer (not shown) disposed on the patterned shading layer part 33. The hard coating layer may also be called a hard mask layer and may be patterned.

The patterned shading layer part, and the patterned phase shift layer may be formed by respectively patterning of the shading layer part and the phase shift layer of the photomask blank.

The shading layer part 30 has a characteristic of at least partially blocking an incident exposure light. Additionally, when a phase shift layer 20 or the like is disposed between a light-transmitting substrate 10 and a shading layer part 30, the shading layer part 30 has an etching characteristic distinguished from neighboring films such as a phase shift layer in a process of etching the phase shift layer 20 and the like to have a pattern shape, and thereby also functions as an etching mask.

In example embodiments, the shading layer part 30 comprises a patterned first shading layer 331 having a first hardness; and a patterned second shading layer 332 having a second hardness.

Unless specially stated below, the descriptions of a patterned shading layer part, a patterned first shading layer, a patterned second shading layer, and the like are also applied to the descriptions of a shading layer part, a first shading layer, a second shading layer, and the like to be the same.

The first hardness may be a larger value than the second hardness.

The second shading layer is disposed on an upper portion of the shading layer part. The first shading layer is disposed on a lower portion of the shading layer part. At this time, the hardness of the second shading layer may be a smaller value than the hardness of the first shading layer.

The second shading layer is disposed on the side at a long distance from the light-transmitting substrate. In this time, the side with a long distance refers to the relative position of the second shading layer based on the first shading layer being more distant than the light-transmitting substrate. At this time, the hardness of the second shading layer may be a small value than the hardness of the first shading layer.

Figure 6A:
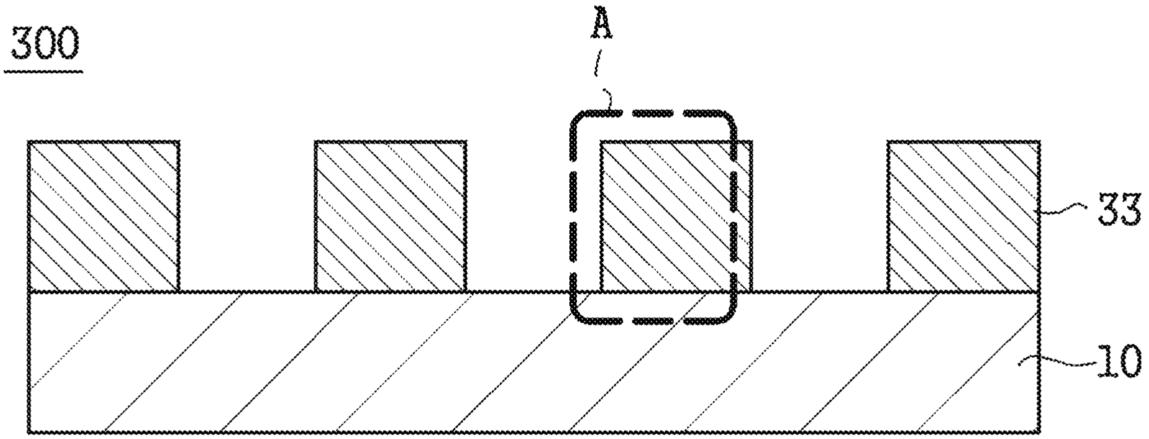
FIG. 6*a* and FIG. 6*b* are enlarged conceptual views of A part in FIG. 6*a* related to the section and the formation of particles of Comparative Examples.
Figure 6B:
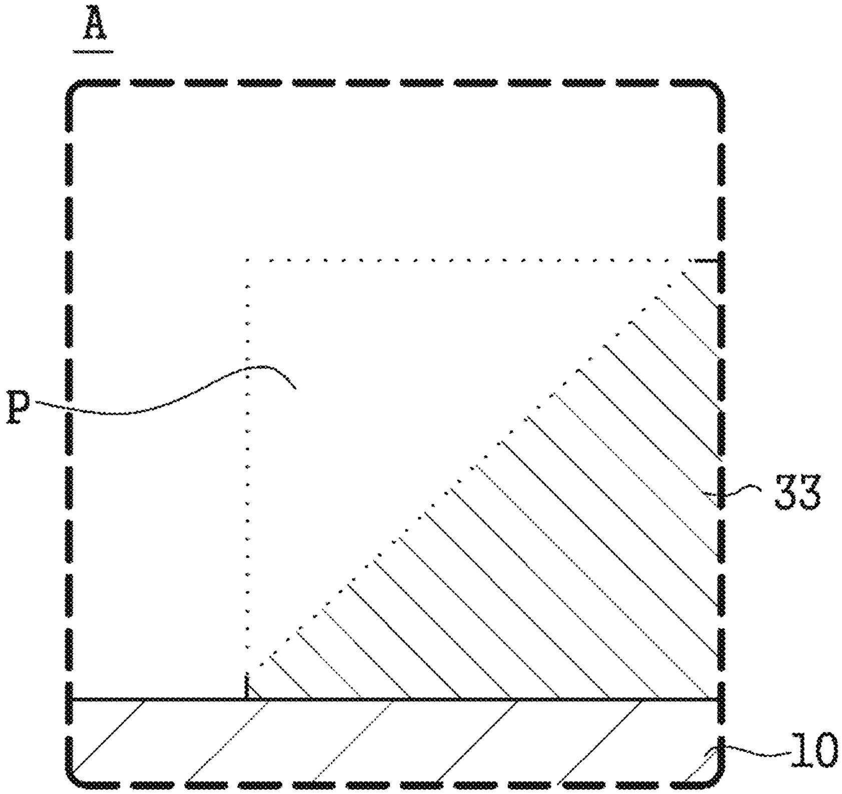

As the hardness of the second shading layer has a smaller value than the hardness of the first shading layer, the frequency of the particle occurrence which may occur due to some loss of the shading layer part can be reduced, and the possibility of the scratch occurrence caused from particles can also be remarkably reduced. Additionally, the size of generated particles is formed to be smaller than the shading layer part with monolayer, and therefore, the generation of scratching particles can be further suppressed (Refer to FIG. 5, FIG. 6*a* and FIG. 6*b*.)

The second hardness may be 0.15 to 0.55 times of the first hardness. The second hardness may be 0.2 to 0.4 times the first hardness. When the second hardness is less than 0.15 times the first hardness, the etching rate may slow down in etching applied with an etchant such as a chlorine-based gas. When the second hardness is more than 0.55 times the first hardness, the effect of lowering the possibility of damage caused by particles may be insignificant. When the second hardness is 0.2 to 0.4 times of the first harness, the possibility of degrading an etching characteristic can be minimized, and simultaneously the effect of lowering the possibility of damage caused by particles can be sufficiently obtained.

The second hardness may be 0.55 kPa or less. The second hardness may be 0.3 to 0.55 kPa. The second hardness may be 0.42 to 0.52 kPa. The second hardness may be 0.45 to 0.51 kPa. In such a range, the first shading layer may properly induce the effect of suppressing the occurrence of scratches caused by particles while having suitable optical properties in the shading layer part overall.

The first harness may be 1 to 3 kPa. The first harness may be 1.1 to 2.5 kPa. The first hardness may be 1.3 to 2.5 kPa. When having such a range of the first hardness, a first shading layer can have suitable transmissivity, optical density, and etching characteristics for the shading layer part overall, and it may be more suitable to be applied by a light source with the wavelength of 193 nm.

The first shading layer 301 may have a first Young's modulus.

The second shading layer 302 may have a second Young's modulus.

The second shading layer is disposed on an upper portion of the shading layer part. The first shading layer is disposed on a lower portion of the shading layer part. At this time, the Young's modulus of the second shading layer may be a smaller value than the Young's modulus of the first shading layer.

The second shading layer is disposed on the side at a long distance from the light-transmitting substrate. The side with a long distance from the light-transmitting substrate refers to the relative position of the second shading layer based on the first shading layer being more distant than the light-transmitting substrate. The Young's modulus of the second shading layer may be a smaller value than the Young's modulus of the first shading layer.

As the Young's modulus of the second shading layer has a smaller value than the Young's modulus of the first shading layer, the frequency of the particle occurrence which can occur due to some loss of the shading layer part can be reduced, and the possibility of the scratch occurrence caused from particles can also be remarkably reduced.

The second Young's modulus may be 0.15 to 0.55 times the first Young's modulus. The second Young's modulus may be 0.20 to 0.45 times the first Young's modulus. The second Young's modulus may be 0.23 to 0.42 times the first Young's modulus.

When the second Young's modulus is less than 0.15 times of the first Young's modulus, the etching rate may slow down in etching applied with an etchant such as a chlorine-based gas. When the second Young's modulus is more than 0.55 times of the first Young's modulus, the effect of lowering the particle occurrence may be insignificant. When the second Young's modulus is 0.2 to 0.45 times of the first Young's modulus, the degradation of an etching characteristic is minimized in etching applied with an etchant such as a chlorine-based etching gas and simultaneously the effect of lowering the possibility of damage caused from the particle occurrence can be sufficiently obtained.

The second Young's modulus may be 1.0 kPa or more. The second Young's modulus may be 1.0 to 4.2 kPa. The second Young's modulus may be 1.2 to 3.7 kPa. The second Young's modulus may be 2.3 to 3.5 kPa. In such a range, the first shading layer may properly induce the effect of suppressing the particle occurrence while having a suitable etching characteristic in the shading layer part overall.

The first Young's modulus may be 7 to 13 kPa. The first Young's modulus may be 7.3 to 12 kPa. The first Young's modulus may be 8 to 11.8 kPa. When having a range of the first Young's modulus, the first shading layer can have proper transmissivity, optical density, and etching characteristics in the shading layer part overall, and it may be more suitable to be applied by a light source having a wavelength of 193 nm.

The hardness and the Young's modulus may be measurable by using AFM. In detail, the measurement is made by using AFM apparatus available from PARK SYSTEM (model XE-150) and applying PPP-CONTSCR available from PARK SYSTEM (model Cantilever) at Contact Mode with a scan speed of 0.5 Hz. Adhesion force and the like are measured at sixteen spots within a measuring target and the average value is taken, and the hardness or Young's modulus values obtained from the above is applied as the above hardness or Young's modulus value. The measuring tip applied during measurement is the Berkovich tip (the Poisson's ratio of the tip:0.07) made from a silicon material, and the measured result of hardness and Young's modulus is disclosed by applying Oliver and Pharr Model and taking values obtained by a program provided from the company of AFM apparatus.

Pull-off force, adhesion force, and the like are obtained by the measurement. The pull off force and/or adhesion force measured at sixteen positions different from one another have a characteristic of small deviation in the measured values overall, and this means that the properties of the shading layer part have even characteristics at measuring positions overall.

Adhesion forces measured from sixteen positions different from one another of the second shading layer 302 (desirably, respective positions are applied to have at least a distance of 1 cm or more from one another) may have a standard deviation of 8% or less, 6% or less, or 5% or less of the average of the adhesion forces. The standard deviation may be 0.001% or more of the average of the adhesion forces. A photomask blank 100 or a photomask 300 having such a characteristic can lower the scratch occurrence caused by particles and evenly suppress the particle formation, even though a minute pattern is formed overall.

The adhesion force of the second shading layer 302 may be 0.25 fJ or more. The adhesion force of the second shading layer 302 may be 0.30 fJ or more. The adhesion force of the second shading layer 302 may be 0.4 fJ or less.

Shading Layer Part 30 and Patterned Shading Layer Part 33

In example embodiments, a shading layer part 30 may be disposed on the top side of a light-transmitting substrate 10. The shading layer part 30 may be placed in the bottom side of the light-transmitting substrate 10, and the adhesion force of the second shading layer 302 may have a larger value than the adhesion force of the first shading layer 301 by 0.10 fJ or more. The adhesion force of the second shading layer 302 may have a larger value than the adhesion force of the first shading layer 301 by 0.15 fJ or less.

Pull off forces measured at sixteen positions different from one another of the second shading layer 302 may have a standard deviation of 5% or less, 3% or less, or 2% or less of the average of the pull off forces. The standard deviation may be 0.001% or more of the average of the pull off forces. A photomask blank 100 or a photomask 300 having such a characteristic can lower the scratch occurrence caused by particles and evenly suppress the particle formation, even though a minute pattern is formed overall.

The pull off force of the second shading layer 302 may be 4.0 nN or more. The pull of force of the second shading layer 302 may be 4.1 nN or more. The pull off force of the second shading layer 320 may be 4.8 nN or less.

The pull off force of the second shading layer 302 may be a larger value than the pull off force of the first shading layer 310 by 0.6 nN or more. The pull off force of the second shading layer 302 may be a larger value than the pull off force of the first shading layer 301 by 1.2 nN or less.

The first shading layer 301 and the second shading layer 302 may have a thickness ratio of 1:0.02 to 0.25. The first shading layer 301 and the second shading layer 302 may have a thickness ratio of 1:0.04 to 0.18. The shading layer part 30, comprising both the first and second shading layers, can have characteristics of lowering the particle generation and scratches in the above and satisfying conditions such as transmissivity and optical density.

The second shading layer 302 may have a thickness of 30 to 80 nm. The second shading layer 302 may have a thickness of 40 to 70 nm. When the second shading layer is formed in such a thickness, the effect of lowering the particle formation can be more excellent.

The thickness or thickness ratio may be checked by layer distinction verified in photographs obtained by using a microscope at the section, and the method for checking the thickness can be applied without limitation.

The shading layer part 30 may have a transmissivity of 1 or more, or 1.33 or more with respect to a light of wavelength of 193 nm. The shading layer part 30 may have a transmissivity of 1.38 or more, or 1.4 or more with respect to a light of a wavelength of 193 nm. The shading layer part 30 may have a transmissivity of 1.6 or less with respect to a wavelength of 193 nm.

The shading layer part 30 may have an optical density of 2.0 or less, or 1.87 or less with respect to a wavelength of 193 nm. The shading layer part 30 may have an optical density of 1.8 or more, or 1.83 or more with respect to a light of wavelength of 193 nm.

The optical density of a laminate comprising the shading layer part 30 and the phase shift layer 20 may be 3.0 or more.

When the shading layer part has such transmissivity and optical density, it can give a desired and excellent shading effect to a photomask or a photomask blank.

The first shading layer 301 and the second shading layer 302 contain a metal atom in respective layers thereof.

A transition metal may be applied as the metal, and any one selected from the group consisting of Cr, Ta, Ti and Hf as the transition metal. In further detail, the first shading layer part 30 and/or the second shading layer part 30 may contain chrome.

The metal comprised in the first shading layer 301 or the second shading layer 302 gives a shading characteristic depending on the amount and simultaneously influences physical properties such as hardness. However, the properties may have a difference due to various factors such as the density of a shading layer, the crystallinity of elements comprised in a shading layer, the amount of non-metal atoms in a shading layer, the arrangement of respective constituent elements.

The second shading layer 302 may have a higher metal amount than the first shading layer 301. However, not only controlling the hardness and Young's modulus characteristics, but also satisfying the entire optical properties, an etching characteristic, and the like desired in a photomask has to be made completely, and therefore, controlling the entire properties may be difficult when only the metal amount is simply heightened.

The property difference in hardness between the second shading layer 302 and the first shading layer 310 may also be adjusted by the amount ratio of an inert gas applied in a sputtering process for deposition, the ratio of a reactive gas applied to the formation of a first shading layer and a second shading layer, and the like, in addition to the amount of a metal described in the above. The detailed description will be made below.

Other Thin Films

A phase shift layer, a hard mask layer, a photoresist layer, and the like may be applied to a photomask blank or a photomask, as the above description.

In the photomask blank 100, a light-transmitting substrate 10, a phase shift layer 20, a shading layer part 30, a photoresist layer (not shown) may be laminated in order, wherein a hard mask layer (not shown) may be further disposed between the shading layer part and the photoresist layer.

A phase shift layer 20 may be disposed between the light-transmitting substrate 10 and the shading layer part 30. The phase shift layer 20 functions by attenuating the strength of an exposure light transmitting the phase shift layer 20, adjusting the phase retardation, and substantially suppressing the diffraction light occurring at the edge of a transcribed pattern.

The light-transmitting substrate 10 may have a transmissivity of 85% with respect to an exposure light with the wavelength of 193 nm. The transmissivity may be 87% or more. The transmissivity may be 99.99% or less. For example, the light-transmitting substrate 10 may be a synthetic quartz substrate. In such a case, the light-transmitting substrate 10 may suppress the attenuation of a light transmitting the light-transmitting substrate 10. However, the material of the light-transmitting substrate 10 may be any material which can be applied to a photomask 300 with a light transmittance with respect to an exposure light without limitation.

The phase shift layer 20 may have a phase retardation of 170 to 190° with respect to a light with the wavelength of 193 nm. The phase shift layer 20 may have a phase retardation of 175 to 185° with respect to a light with the wavelength of 193 nm. The phase shift layer 20 may have a transmissivity of 3 to 10% with respect to a light with the wavelength of 193 nm. The phase shift layer 20 may have a transmissivity of 3 to 10% with respect to a light with the wavelength of 193 nm. The phase shift layer 20 may have a transmissivity of 4 to 8% with respect to a light with the wavelength of 193 nm. In such a case, the resolution of the photomask 300 comprising the phase shift layer 20 can be improved.

The phase shift layer 20 may comprise a transition metal and silicon. The phase shift layer 20 may comprise a transition metal, silicon, oxygen, and nitrogen. The transition metal may be molybdenum.

The description of the patterned phase shift layer 23 is applied as the same as the above description of the phase shift layer 20.

The hard mask (not shown) may suppress the phenomenon of pattern collapse, which is the breakage of a photoresist layer during pattern etching. Additionally, the hard mask may also function as an etching mask film in a patterning process of a shading layer part 30.

The hard mask may comprise any one selected from silicon, nitrogen, and oxygen. For example, the hard mask may be SiON or SiN, but not limited thereto.

Utilization and Manufacture

The photomask 300 is patterned depending on a desired design from the photomask blank 100, and the patterning process passes through at least several etching and cleaning processes. For example, the desired pattern is formed on a photoresist layer through exposure and development, and a hard mask layer and the like are exposed by selective etching. Thereafter, an etchant having a relatively large selection ratio with respect to the hard mask layer and the shading layer part is utilized, and thereby predetermined portions depending on the design of the hard mask layer and the shading layer part are removed. In this time, the etchant may be changed and thereby the phase shift layer can be removed together. Subsequently, some or the whole of the hard mask layer and the shading layer part is removed as needed, and an etchant is also applied in the removing process. The etchant is selectively applied depending on the characteristics of respective films, and in the case of dry etching, a fluorine-based etchant, a chlorine-based etchant, or the like may be mixed with a reactive gas (oxygen or the like) or an inert gas (nitrogen, helium, or the like) and selectively used. In addition, the etchant is removed in each etching operation, and a cleaning process may be performed to check whether the degree of etching is proper. In such a process, foreign matter may occur in the shape of undesired particles due to the external impact (for example, a physical impact caused by a cleaning solution), chemical damage caused from an etchant, or the correlation thereof, and scratching defects may also occur due to the above.

The photomask blank and/or photomask of example embodiments form a shading layer part itself to have multiple layers and thereby can adjust the properties of two layers disposed up and down, or can reduce the occurrence of foreign matter such as particles in the processes of development, cleaning, and the like by controlling the harness and/or Young's modulus of the shading layer part disposed at an upper portion, and even though particles occur, they can reduce scratching defects caused from them. Additionally, these characteristics are advantages that can be obtained while maintaining the optical properties, thickness characteristic, etching characteristic, and the like of the shading layer part to be a certain level or more.

Hereinafter, the manufacturing method of the shading layer part is described.

The manufacturing method of the shading layer part comprises a preparation operation of equipping a substrate and a sputtering target in a sputtering chamber; a film formation operation of forming a shading layer part on the substrate by adding electric power to the sputtering target; a thermal treatment operation of treating the formed shading layer part with heat and thereby controlling and stabilizing the residual stress; and a cooling operation of cooling the stabilized shading layer part.

The substrate may be applied by a light-transmitting substrate or one in which a phase shift layer is deposited on the light-transmitting substrate.

The film formation operation comprises a primary film formation process of forming a first shading layer; and a secondary film formation of forming a second shading layer on the first shading layer.

The primary film formation process and the secondary film formation process are performed in order, and respectively a first shading layer and a second shading layer are formed, wherein a metal target is applied with an atmosphere gas together.

The metal target may be a target of a desired metal in the case of reactive sputtering, and for example, a chrome target may be applied in the case of applying chrome as a transition metal.

The atmosphere gas may be applied to be different depending on the composition, thickness, density, and the like of desired first shading layer and/or second shading layer, and an inert gas and a reactive gas are mixed to be used.

As the inert gas, argon gas, helium gas, and the like may be applied alone or mixed. The application of the inert gas has a part in a deposition process in a sputtering process, and the inert gas is removed in subsequent thermal treatment or the like, and it is thought to be related to controlling the density of a layer.

As the reactive gas, a gas comprising nitrogen atoms, oxygen atoms, or the like may be applied alone or mixed. Carbon dioxide may be applied together as needed. For example, the reactive gas may be $CO_2$, $O_2$, $N_2$, NO, $NO_2$, $N_2O$, $N_2O_3$, $N_2O_4$, $N_2O_5$, and the like, but not limited thereto. These gases may affect the composition of a thin film depending on the applied amount, and may also affect the degrees of bond, etching, particle formation, and the like of elements in the film.

The first atmosphere gas, which is an atmosphere gas of the primary film formation process, may be an inert gas, and may be applied with a low molecular inert gas such as argon gas and helium together. When a low molecular inert gas such as helium is applied together in addition to argon gas, it can help control the density of a manufactured shading layer. The primary atmosphere may comprise a reactive gas, and the reactive gas may be a gas containing nitrogen, oxygen, and the like described above. The amount of reactive gas in the primary atmosphere gas is related to the amount of reactive gas in the secondary atmosphere gas described below, and thereby it allows the hardness, Young's modulus, and the like to be further efficiently controlled.

The secondary atmosphere gas, which is an atmosphere gas of the secondary film formation process, is an inert gas applied by argon gas. For sufficiently controlling the harness and the like, a low molecular inert gas such as helium is not separately applied. However, the hardness is adjusted by adjusting the amount of reactive gas.

The ratio of the amount of reactive gas comprised in the secondary atmosphere gas based on the amount of reactive gas comprised in the primary atmosphere gas may be the volume ratio of 0.7 to 1.1, the volume ratio of 0.8 to 1.05, or the volume ratio of 0.85 to 0.95. When the reactive gas is applied in such a volume ratio, control of the hardness, Young's modulus, and the like of the first shading layer and the second shading layer is further easily made.

The power source applied in the sputtering process may be a DC or RF power source. The electric power applied in the sputtering process may be 0.5 to 5.0 kW.

The sputtering time in the primary film formation process and the secondary film formation process may be applied in a ratio of 100:7 to 32. In such a case, a shading layer part having a desired and proper thickness ratio can be obtained.

The thermal treatment operation is a process of adding heat to be even overall, and it can remove the residual stress which may occur in a sputtering process and can alleviate the bending phenomenon of a photomask blank. The temperature in the thermal treatment operation may be 150 to 330° C. The thermal treatment in the thermal treatment may be performed for about 5 to 50 minutes, excluding heating time.

The cooling operation may perform cooling to be 10 to 30° C., and an inert gas or a dry gas may be applied to the air cooling.

A shading layer part 30 manufactured in this manner comprises a first shading layer 301 and a second shading layer 302, respectively comprising a transition metal and at least any one between oxygen and nitrogen.

The second shading layer 302 may comprise a transition metal in an amount of 50 to 80 at %. The second shading layer 302 may comprise a transition metal in an amount of 55 to 75 at %. The second shading layer 302 may comprise a transition metal in an amount of 60 to 70 at %. The sum value of the oxygen amount and the nitrogen amount of the second shading layer 302 may be 10 to 30 at %. The sum value of the oxygen amount and the nitrogen amount of the second shading layer 302 may be 15 to 25 at %. The second shading layer 302 may comprise nitrogen in an amount of 5 to 15 at %. The second shading layer 22 may comprise nitrogen in an amount of 7 to 13 at %.

The first shading layer 301 may comprise a transition metal in an amount of 30 to 60 at %. The first shading layer 301 may comprise a transition metal in an amount of 31 to 55 at %, or 35 to 55 at %. The first shading layer 301 may comprise a transition metal in an amount of 40 to 50 at %. The sum value of the oxygen amount and the nitrogen amount of the first shading layer 301 may be 40 to 70 at %. The sum value of the oxygen amount and the nitrogen amount of the first shading layer 301 may be 45 to 65 at %. The sum value of the oxygen amount and the nitrogen amount of the first shading layer 301 may be 50 to 60 at %. The first shading layer 301 may comprise oxygen in an amount of 20 to 37 at %. The first shading layer 301 may comprise oxygen in an amount of 23 to 33 at %. The first shading layer 301 may comprise oxygen in an amount of 25 to 30 at %. The first shading layer 301 may comprise nitrogen in an amount of 20 to 35 at %. The first shading layer 301 may comprise nitrogen in an amount of 26 to 33 at %. The first shading layer 301 may comprise nitrogen in an amount of 26 to 30 at %.

The transition metal may comprise at least any one among Cr, Ta, Ti and Hf. The transition metal may be Cr.

The phase shift layer, the hard mask layer, the photomask film, and the like can be manufactured by an ordinary manufacturing method, and the method is not specially limited.

Manufacturing Method of Semiconductor Element

The manufacture of a semiconductor element with further reduced defects can be made by utilizing the photomask described above.

A manufacturing method of a semiconductor element, according to one embodiment, comprises a preparation operation and a patterning operation. The preparation operation is an operation of preparing a target substrate that becomes a target for patterning.

The target substrate may be a wafer, one in which an electrically conductive layer or an insulating layer is formed on the wafer, a glass substrate, and the like, but is not limited thereto.

The patterning operation is an operation of applying a photomask on one surface of the target substrate and manufacturing a patterned target substrate through a lithography process. As the lithography process, an ordinary lithography process may be applied, and specifically, a lithography process to which ArF light source of 193 nm is applied may be applied.

In detail, a light source; a photomask disposed on a light route of the light source; and a target substrate comprising a photoresist layer is arranged, and the light emitted from the light source and transiting the photomask is transmitted to a photoresist layer of the target substrate. In this time, the photoresist layer of the target substrate is changed for the properties by the light, and a pattern is formed on the target substrate through the process of developing the photoresist layer.

The patterned target substrate is allowed to have a minute wiring pattern made from a semiconductor material by repeating the formation processes of an electrically conductive layer, planation, the formation of an insulating layer, and the like, and may be manufactured into a semiconductor element.

The manufacturing method of a semiconductor element can obtain a pattern with further reduced defects by applying example embodiments described above, and the efficient manufacture of a semiconductor element with excellent quality is possible.

Hereinafter, a further detailed description will be made through detailed examples. The example embodiments below are only examples for helping to understand the present application, and the scope of the present application is not limited thereto.

Manufacture Example: Manufacture of Shading Layer Part

On a synthetic quartz light-transmitting substrate with a width of 6 inches, a length of 6 inches, and a thickness of 0.25 inches, an identical substrate having the same phase shift effect of about 180° with respect to the wavelength of 193 nm was prepared and applied to the manufacture of a shading layer part below.

The substrate was disposed in a chamber of DC sputtering apparatus, and a chrome target was allowed to have a T/S distance of 255 mm, and an angle between the substrate and the target was 25 degrees. When the first shading layer is formed, the electric power was applied to be 1.85 kWh, and the electric power applied to the formation of the second shading layer was 1.5 kWh.

Sputtering was performed as shown in Table 1 by applying an atmosphere gas below while rotating a substrate, and a shading layer part was formed by respectively forming a first shading layer and a second shading layer in order. Thermal treatment was applied to be the same for 15 minutes at 200° C., and the shading layer part after the thermal treatment was treated with cooling by applying dry air for 5 minutes at an atmosphere of 20° C.

TABLE 1

| | | | The Volume Ratio of atmosphere Gas | | | |
|---|---|---|---|---|---|---|
| | Layer Type | Deposition Time (s) | Ar Gas | Reactive Gas | He Gas (Low Molecular Inert Gas) | The Ratio of Reactive Gas# |
| Example 1 | First Shading Layer | 230~300 | 21 | 43* | 36 | 1 |
| | Second Shading Layer | 20~28 | 57 | 43* | 0 | |
| Example 2 | First Shading Layer | 230~300 | 19 | 47** | 34 | 0.915 |
| | Second Shading Layer | 20~28 | 57 | 43* | 0 | |

TABLE 1-continued

| | Layer Type | Deposition Time (s) | The Volume Ratio of atmosphere Gas: Ar Gas | Reactive Gas | He Gas (Low Molecular Inert Gas) | The Ratio of Reactive Gas# |
|---|---|---|---|---|---|---|
| Example 3 | First Shading Layer | 230~300 | 17 | 53*** | 30 | 0.811 |
| | Second Shading Layer | 20~28 | 57 | 43* | 0 | |
| Comparative Example 1 | First Shading Layer | 230~300 | 21 | 43* | 36 | — |
| | Second Shading Layer | — | — | — | — | |
| Comparative Example 2 | First Shading Layer | 230~300 | 21 | 43* | 36 | 1.302 |
| | Second Shading Layer | 20~28 | 44 | 56 | 0 | |
| Comparative Example 3 | First Shading Layer | 230~300 | 19 | 47** | 34 | 0.426 |
| | Second Shading Layer | 20~28 | 80 | 20 | 0 | |

#The ratio of reactive gas applied when a second shading layer is formed based on the reactive gas applied when a first shading layer is formed (volume ratio)

*Reactive gas 43 is applied by $N_2$ and $CO_2$ in a volume ratio of 11 and 32, respectively.

** Reactive gas 47 is applied by $N_2$ and $CO_2$ in a volume ratio of 11 and 36, respectively.

*** Reactive gas 53 is applied by $N_2$ and $CO_2$ in a volume ratio of 24 and 29, respectively.

– The reactive gas of the second shading layer is applied by $N_2$ in the whole.

Experiment Example: Evaluation of Properties Such as Hardness and Young's Modulus The measurement of hardness, Young's modulus, pull off force, adhesion force, and the like was made by AMF. AFM apparatus available from PARK SYSTEM (model XE-150) was used and PPP-CONTSCR available from PARK SYSTEM (model Cantilever) at Contact Mode was applied at a scan speed of 0.5 Hz for the measurement. Adhesion force and the like were measured at sixteen spots within a measuring target and the average value was obtained, and the hardness or the Young's modulus value obtained from the above was shown in Table 3 below as the above hardness or Young's modulus value. The actually measured data at sixteen spots of Example 2 were disclosed in Table 2. The measuring tip applied during the measurement was Berkovich tip (Poisson ratio of the tip:0.07) made from a silicon material, and the result of the measurement of hardness and Young's modulus was taken from values obtained by a program provided by the company of AFM apparatus when Oliver and Pharr Model was applied.

TABLE 2

| Measuring Point | First Shading Layer: Pull off Force (nN) | First Shading Layer: Adhesion Force (fj) | Second Shading Layer: Pull off Force (nN) | Second Shading Layer: Adhesion Force (fj) |
|---|---|---|---|---|
| 1 | 3.7 | 0.22 | 4.55 | 0.35 |
| 2 | 3.68 | 0.21 | 4.41 | 0.33 |
| 3 | 3.63 | 0.21 | 4.41 | 0.33 |
| 4 | 3.59 | 0.2 | 4.37 | 0.32 |
| 5 | 3.53 | 0.2 | 4.4 | 0.33 |
| 6 | 3.52 | 0.19 | 4.31 | 0.32 |
| 7 | 3.47 | 0.19 | 4.39 | 0.33 |
| 8 | 3.61 | 0.2 | 4.27 | 0.32 |
| 9 | 3.57 | 0.2 | 4.34 | 0.31 |
| 10 | 3.45 | 0.19 | 4.29 | 0.31 |
| 11 | 3.56 | 0.2 | 4.41 | 0.34 |
| 12 | 3.45 | 0.19 | 4.36 | 0.33 |
| 13 | 3.36 | 0.18 | 4.37 | 0.33 |
| 14 | 3.52 | 0.19 | 4.29 | 0.3 |
| 15 | 3.49 | 0.19 | 4.18 | 0.3 |
| 16 | 3.47 | 0.19 | 4.27 | 0.3 |
| Average | 3.538 | 0.197 | 4.351 | 0.322 |
| Standard Deviation* | 0.091 | 0.010 | 0.084 | 0.015 |
| The Ratio of Standard Deviation Compared to the Average (%) | 2.567 | 5.153 | 1.935 | 4.569 |

*Standard deviation was applied by STDEV.S function of Excel.

Optical properties were measured by an ordinary method using Ellipsometer, and the transmissivity and optical density of the entire shading layer part were shown in Table 3 with information of the hardness, Young's modulus, and the like.

The etching ratio was the result of operation under all the same conditions by an ordinary dry etching method applying a chlorine-based gas.

TABLE 3

| | Layer Type | Hardness (kPa) | Hardness Ratio* | Young's Modulus (kPa) | Young's Modulus Ratio** | Transmissivity | Optical Density | Etching Ratio (Etch Rate) |
|---|---|---|---|---|---|---|---|---|
| Example 1 | First Shading Layer | 1.331 | 0.370 | 7.403 | 0.372 | 1.323 | 1.88 | 1.6 Å/s |
| | Second Shading Layer | 0.493 | | 2.751 | | | | |
| Example 2 | First Shading Layer | 1.630 | 0.302 | 9.040 | 0.305 | 1.412 | 1.85 | 1.8 Å/s |
| | Second Shading Layer | 0.493 | | 2.760 | | | | |
| Example 3 | First Shading Layer | 2.050 | 0.242 | 11.314 | 0.246 | 1.526 | 1.82 | 1.9 Å/s |
| | Second Shading Layer | 0.496 | | 2.780 | | | | |
| Comparative Example 1 | First Shading Layer | — | — | — | — | 1.415 | 1.85 | 1.9 Å/s |
| | Second Shading Layer | — | | — | | | | |
| Comparative Example 2 | First Shading Layer | 1.338 | 0.618 | 7.453 | 0.621 | 1.417 | 1.85 | 1.7 Å/s |
| | Second Shading Layer | 0.828 | | 4.626 | | | | |
| Comparative Example 3 | First Shading Layer | 1.640 | 0.102 | 9.101 | 0.101 | 0.993 | 2.02 | 1.1 Å/s |
| | Second Shading Layer | 0.167 | | 0.920 | | | | |

*Hardness ratio is the ratio of the second shading layer based on the hardness of the first shading layer.

**Young's modulus ratio is the ratio of the second shading layer based on the Young's modulus of the first shading layer.

Comparative Example 1 corresponds to a shading layer part with a monolayer in which hardness or the like is not controlled, and multiple particles formed in a cleaning process or the like were observed, and one of the reasons thereof was damage occurring at the edge portion of the shading layer part pattern. The inventors noticed the above problems and controlled hardness, Young's modulus, and the like for suppressing the occurrence of such particles and preventing the damage of a photomask even though particles occur. A shading layer part must have characteristics for reducing particle occurrence, such as hardness, in addition to maintaining optical properties desired in the shading layer part of the photomask. When the metal amount of the second shading layer was too much increased, the effect of controlling hardness was insignificant and thereby the effect of improving particles became slight, and when the hardness of the second shading layer was too much lowered, the control of an etching characteristic was difficult. The cases of Examples 1 to 3 were verified to obtain desired effects of controlling hardness, Young' modulus, and the like while maintaining a proper etching characteristic and the like.

Figure 7A:
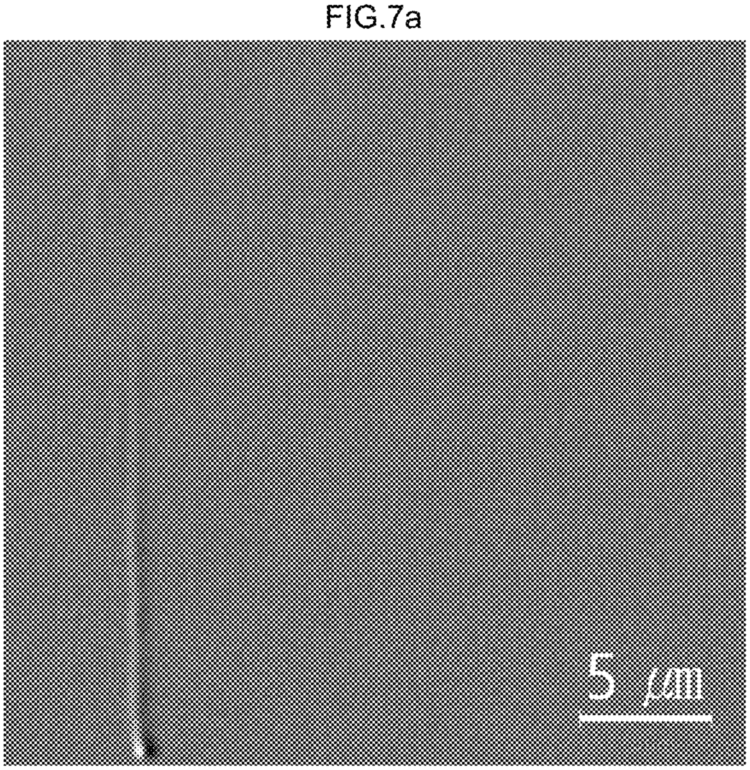
FIG. 7*a* and FIG. 7*b* are photographs showing examples of the formation of scratching particles in Comparative Example 1 and Comparative Example 2 of experimental embodiments, respectively (the result after application of HF filter to an inspector).
Figure 7B:
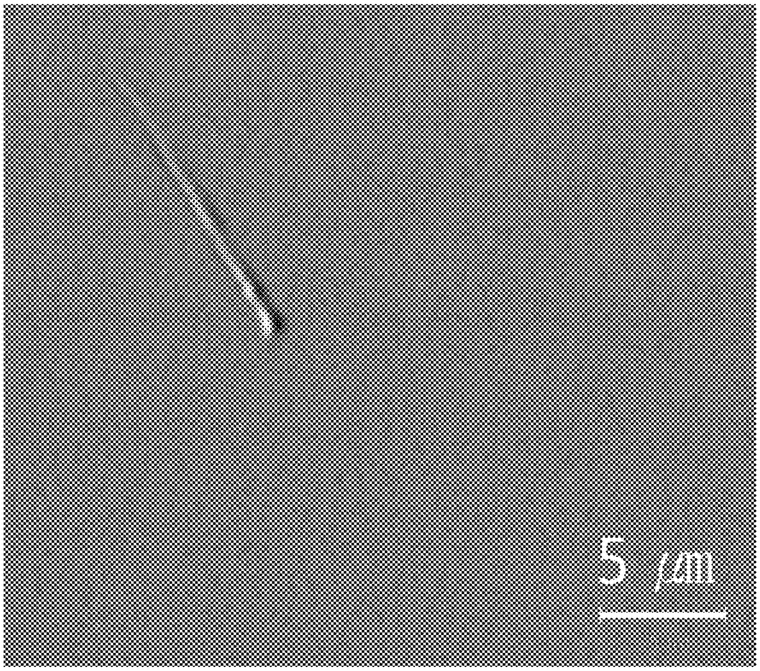

Example 2 was confirmed to have the most excellent effects of lowering particles, scratches caused by particles, and the like, because of having regular properties in the film overall. In the cases of Comparative Examples, the result of evaluating scratching defects was shown in FIG. 7 and FIG. 7*b*, by an example from the inspection result through a validator (image inspection by HF filter). FIG. 7*a* was the result of an inspection of Comparative Example 1, and ascertained to generate large scratching particles and have multiple particles. The size of a generated particle was large, as shown in schematic diagrams of FIG. 6*a* and FIG. 6*b*, and it is thought that the scratching particles were easily generated due to the above. FIG. 7*b* was the result of an inspection of Comparative Example 2, and it was confirmed that the size and number of scratching particles were reduced, but the frequency of particle occurrence was still considerable.

A photomask blank of one embodiment applies a shading layer part adjusted in the hardness and thereby can provide a photomask blank that can reduce defects caused by particles while maintaining other performance to be the same or more.

A photomask of another embodiment can provide a photomask that can reduce defects caused by particles and obtain a more improved shading effect, even though a pattern with a further refined critical dimension is applied.

A manufacturing method of a semiconductor element of another embodiment utilizes a photomask described above and thereby can manufacture a semiconductor element in which defects are further reduced.

The photomask blank, photomask, and the like of example embodiments have improved defect resistance performance, and the manufacturing method of a semiconductor element provides a manufacturing method with high accuracy to reduce defect occurrence.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A photomask blank, comprising:

a light-transmitting substrate; and a shading layer part disposed on the light-transmitting substrate and comprising a first shading layer having a first hardness and a second shading layer having a second hardness, wherein the first shading layer thicker than the second shading layer is disposed closer to the light-transmitting substrate than the second shading layer having the second hardness smaller than the first hardness, and wherein the second hardness is 0.15 to 0.55 times the first hardness, and wherein a value of a standard deviation of pull-off forces of the second shading layer, measured at sixteen different locations on the second shading layer, is 5% or less of an average of the pull-off forces.

2. The photomask blank of claim 1, wherein a value of standard deviation of adhesion forces of the second shading layer is-measured at sixteen positions different from one another is 5% or less of an average of the adhesion forces.

3. The photomask blank of claim 1, wherein a second Young's modulus of the second shading layer is 0.15 to 0.55 times a first Young's modulus of the first shading layer.

4. The photomask blank of claim 1, wherein a thickness of the second shading layer is 30 nm or more.

5. The photomask blank of claim 1, wherein a thickness ratio of the first shading layer to the second shading layer is 1:0.02 to 0.25.

6. The photomask blank of claim 1, wherein a transmissivity of the shading layer part is 1% or more for light having a wavelength of 193 nm.

7. The photomask blank of claim 1, wherein an optical density of the shading layer part is 1.8 or greater for light having a wavelength of 193 nm.

8. A photomask blank, comprising:

a light-transmitting substrate; and a patterned shading layer part disposed on the light-transmitting substrate and comprising a patterned first shading layer having a first Young's modulus and a patterned second shading layer having a second Young's modulus smaller than the first Young's modulus, wherein the patterned first shading layer thicker than the patterned second shading layer is disposed closer to the light-transmitting substrate than the patterned second shading layer having a second hardness smaller than a first hardness of the patterned first shading layer, wherein the second hardness is 0.15 to 0.55 times the first hardness, and wherein a value of a standard deviation of pull-off forces of the patterned second shading layer, measured at sixteen different locations on the patterned second shading layer, is 5% or less of an average of the pull-off forces.

9. A manufacturing method of a semiconductor element, the method comprising:

providing a target substrate;

placing a photomask on one surface of the target substrate to pattern the target substrate; and forming the patterned target substrate into a semiconductor element, wherein the photomask comprises a patterned shading layer part disposed on a light-transmitting substrate, wherein the patterned shading layer part comprises a patterned first shading layer having a first Young's modulus and a patterned second shading layer having a second Young's modulus smaller than the first Young's modulus, and wherein the patterned first shading layer thicker than the patterned second shading layer is disposed closer to the light-transmitting substrate than the patterned second shading layer having a second hardness smaller than a first hardness of the patterned first shading layer, and wherein the second hardness is 0.15 to 0.55 times the first hardness, and wherein a value of a standard deviation of pull-off forces of the patterned second shading layer, measured at sixteen different locations on the patterned second shading layer, is 5% or less of an average of the pull-off forces.

* * * * *